(12) United States Patent
He et al.

(10) Patent No.: US 8,710,853 B2
(45) Date of Patent: Apr. 29, 2014

(54) CAPACITANCE SENSING

(75) Inventors: Mee Hing He, Singapore (SG); Leela Madhuri Bhaskarabhotla, Singapore (SG); Arno Rabenstein, Munich (DE); Qian Zhao, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 673 days.

(21) Appl. No.: 12/871,966

(22) Filed: Aug. 31, 2010

(65) Prior Publication Data
US 2012/0053873 A1    Mar. 1, 2012

(51) Int. Cl.
*G01R 27/26* (2006.01)

(52) U.S. Cl.
USPC .......................................................... 324/678

(58) Field of Classification Search
USPC ........ 324/678, 60, 61, 512, 519, 658, 750.17; 702/65, 67, 104, 117
See application file for complete search history.

(56) References Cited

U.S. PATENT DOCUMENTS

| | | | |
|---|---|---|---|
| 4,860,232 A * | 8/1989 | Lee et al. | 702/104 |
| 5,439,004 A * | 8/1995 | Duong-Van et al. | 600/518 |
| 6,087,934 A * | 7/2000 | Golab | 340/540 |
| 6,573,753 B1 * | 6/2003 | Snyder | 326/87 |
| 7,592,819 B2 * | 9/2009 | Kawate et al. | 324/679 |
| 8,022,714 B2 * | 9/2011 | Bartling | 324/658 |
| 2002/0140438 A1 * | 10/2002 | Lund et al. | 324/678 |
| 2004/0236525 A1 * | 11/2004 | Nelson et al. | 702/56 |
| 2005/0072931 A1 * | 4/2005 | Albagli et al. | 250/370.11 |
| 2008/0036473 A1 * | 2/2008 | Jansson | 324/678 |
| 2008/0196945 A1 * | 8/2008 | Konstas | 178/18.03 |
| 2008/0246723 A1 * | 10/2008 | Baumbach | 345/156 |
| 2009/0174416 A1 * | 7/2009 | Ely et al. | 324/678 |
| 2010/0127717 A1 * | 5/2010 | Cordeiro et al. | 324/678 |

FOREIGN PATENT DOCUMENTS

WO    2010062513 A1    6/2010

OTHER PUBLICATIONS

Marcel Flipse, Capacitive Sensing with PIC10F, Microchip Technology Inc., AN1202, 2008, pp. 1-10.
8-Bit XC82x 8-Bit Single-Chip Microcontroller, Chapter 21 Analog to Digital Converter, subchapter 21.8.3 Limit Checking, User's Manual V1.1, pp. 21-52 til 21-54 , Infineon Technologies AG, Jun. 2010, http://www.infineon.com/cms/en/product/channel.html?channel=db3a304326dfb13001270a602ac3325f&tab=2.
Atmel Touch Technology, pp. 1-104; http://www.atmel.com.

* cited by examiner

*Primary Examiner* — Jermele M Hollington
*Assistant Examiner* — Giovanni Astacio-Oquendo
(74) *Attorney, Agent, or Firm* — SpryIP, LLC (57) ABSTRACT

Embodiments related to sensing a capacitance are described and depicted.

23 Claims, 6 Drawing Sheets

CAPACITANCE SENSING

BACKGROUND

In many application, it is necessary to sense a capacitance for example to determine a change of a capacitance or to determine the value of a capacitance. For example, nowadays many application are provided with a touch sensing function in which the controlling, starting or ending of an operation is based on the touching of a touch sensitive element by a user. The touching of the element is then determined by determining a change of the capacitance.

In view of this there is a need for capacitance sensing methods and devices and more flexible capacitance sensing. Furthermore, there is a need for capacitance sensing concepts which can be easily integrated and performed by microcontroller devices.

SUMMARY

In one aspect, an embodiment includes a microcontroller having an analog-to-digital converter to provide a digital value based on an analog input signal. A limit checker is provided to determine whether the digital value is within a predetermined range and to generate an output signal when the digital value is determined to be out of the predetermined range. At least a first input is connected or connectable to the analog-to-digital converter. At least one switch is provided and configured to alternately couple the first input to a first potential for charging the capacitance and to a second potential for discharging the capacitance. Furthermore, an entity is provided which is capable to determine a change of the capacitance based on the alternately charging and discharging of the capacitance.

In a further aspect, a method for detecting a change of a capacitance includes the feeding of a signal from a first input connected to the capacitance to an analog-to-digital converter and the repeatedly generating of a switching signal based on a digital output signal of the analog-to-digital converter. A switching between charging the capacitance and discharging the capacitance based on the switching signal is provided and the change of the capacitance based on the switching between charging and discharging is detected.

In a further aspect, a method for sensing a capacitance includes programming values of an upper and lower threshold limit and generating a switching signal when an output of an analog-to-digital converter reaches one of the programmed values. A switching between charging a capacitance coupled to an input of the analog-to-digital converter and discharging the capacitance is provided such that the switching is based on the switching signal. The capacitance is sensed based on the switching between charging and discharging.

In a further aspect, a device comprises an oscillator circuit to provide an oscillation used for determining a change of a capacitance. The oscillator circuit includes a circuit to provide a digital value based on an analog input signal, a limit checker to determine whether the digital value is within a programmed range and to generate an output signal when the digital value is determined to be out of the predetermined range and at least a first input coupled to an input of the analog-to-digital converter. The oscillator circuit further includes at least one switch configured to alternately connect an electrode of the capacitance to a first potential and to a second potential to alternately charge and discharge the capacitance via at least one impedance, the at least one switch being controlled based on the output signal of the limit checker.

DETAILED DESCRIPTION

The following detailed description explains exemplary embodiments of the present invention. The description is not to be taken in a limiting sense, but is made only for the purpose of illustrating the general principles of embodiments of the invention while the scope of protection is only determined by the appended claims.

In the exemplary embodiments shown in the drawings and described below, any direct connection or coupling between functional blocks, devices, components or other physical or functional units shown in the drawings or described herein can also be implemented by an indirect connection or coupling. Functional blocks may be implemented in hardware, firmware, software, or a combination thereof.

Further, it is to be understood that the features of the various exemplary embodiments described herein may be combined with each other, unless specifically noted otherwise.

In the various figures, identical or similar entities, modules, devices etc. may have assigned the same reference number.

Figure 1:
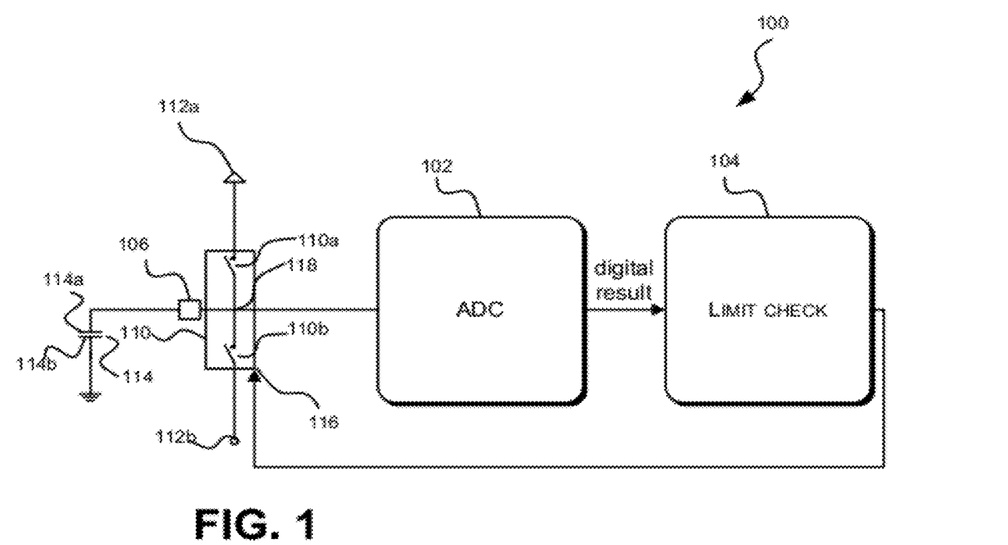
FIG. 1 shows a block diagram according to an embodiment.

FIG. 1 shows an embodiment of a device 100 including an analog-to-digital converter 102 and a limit checker 104. In one embodiment, the device 100 is a microcontroller such as a general purpose microcontroller or a dedicated microcontroller. An output of the analog-to-digital converter 102 is connected to an input of the limit checker 104. An input of the analog-to-digital converter 102 is connected to a signal input 106. The input 106 constitutes an input which in operation is coupled to an electrode of a capacitance 114 such as a capacitance of a touch sensitive element sensed in touch sense detection for detecting the touching of an element by the finger of a human being. For example, in one embodiment the capacitance 114 may be a capacitance of a touch pad. The input 106 may be a pin such as a common input pin or an input port of the device or a circuit node in the circuitry of the device 100.

The device 100 further includes a switch 110 having a first switch element 110a and a second switch element 110b. The switch elements 110a and 110b are in an embodiment switching transistors such as a MOS transistor or a bipolar transistor or a circuit including switching transistors or any other switch elements. The first switch element 110a is provided to connect the input 106 with a first potential 112a via a node 118 or to disconnect the input 106 from the first potential 112a. The second switch element 110b is provided to connect the input 106 with a second potential 112b via the node 118 or to disconnect the input 106 from the second potential 112b. In one embodiment, one of the first or second potential 112a and 112b may be a potential of a positive supply voltage such as VDD and one of the first or second potential 112a and 112b may be ground or may be a potential of a negative supply voltage.

Figure 6A:
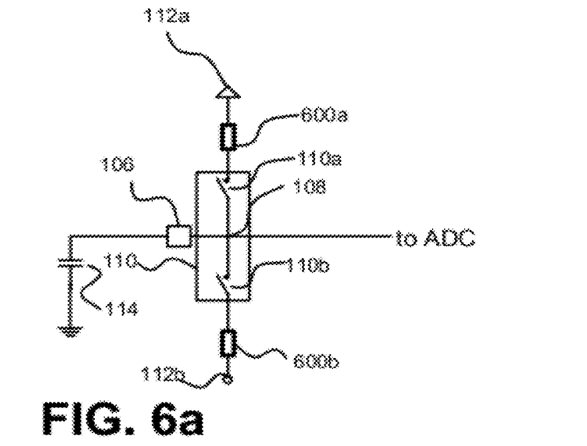
FIGS. 6a, 6b and 6c shows exemplary embodiments of impedance configurations.
Figure 6B:
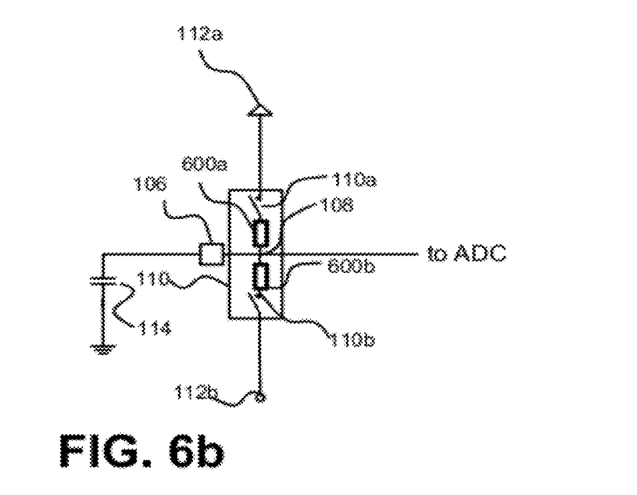
Figure 6C:
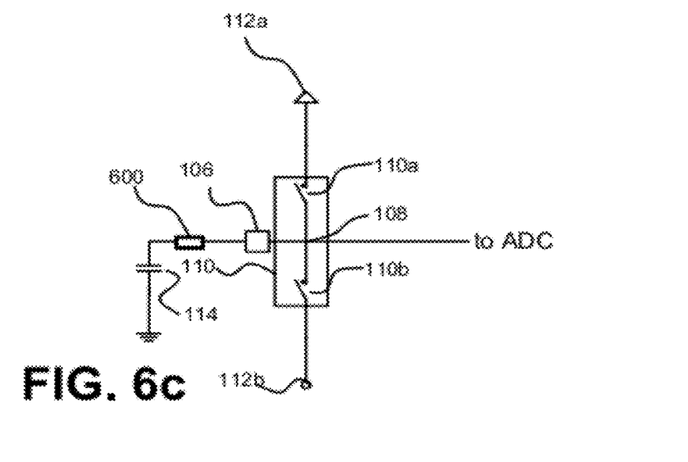

The connection of the input 106 with the first and second potentials 112a and 112b provides a charging or discharging of the capacitance 114 via at least one impedance (not shown in FIG. 1). Whether the capacitance is charged or discharged depends on which of the first and second potentials 112a and 112b is coupled to the capacitance 114. For the at least one impedance provided for charging and discharging the capacitance 114 several exemplary configurations are shown in FIGS. 6a-6c. In one embodiment shown in FIG. 6a, the at least one impedance may include a first impedance 600a and a second impedance 600b. The first impedance 600a is connected between the first switch element 110a and the first potential 112a and the second impedance 600b is connected between the second switch element 110b and the second potential 112b. In one embodiment, the first impedance may be a pull-up resistor and the second impedance may be a pull-down resistor associated with an input pin or input port of the device 100. In one embodiment, the first impedance 600a and the second impedance 600b can be arranged between the node 118 and the respective first and second switch elements 110a and 110b as shown in FIG. 6b. Furthermore, the at least one impedance via which the capacitance is charged may be a single impedance connected between the capacitance 114 and the input 106. FIG. 6c shows such an implementation. Equally, the single impedance may also be connected between the input 106 and the node 108.

In embodiments, the switching of the first and second switch elements 110a and 110b is provided alternating. For example the first switch element 110a is closed when the second switch element 110b is opened and vice versa. The alternating switching provides an alternating coupling of a first electrode 114a of the capacitance 114 with the first potential 112a and the second potential 112b. This causes the repetitive charging and discharging of the capacitance 114 and establishes an oscillation of the voltage present at the capacitance 114. In other words, the impedances used for charging and discharging form with the capacitance 114 a RC network and the voltage of this RC network is continuously scanned by the analog-to-digital converter 102.

Assuming the second electrode 114b of the capacitance 114 to be held at fixed electric potential, for example as shown in FIG. 1 at ground potential, the voltage between the electrodes of the capacitance 114 is represented by the potential at input 106 subtracted by the value of the fixed potential. In case one of the potentials being ground, i.e. 0V, the electric potential at the input 106 represents directly the voltage between the electrodes of the capacitance 114.

As will be described below in more detail, parameters of the continuous oscillation established by the alternating charging and discharging depend on the value of the capacitance 114 and can therefore be used for determining the value of the capacitance 114 or deciding whether the value of the capacitance 114 has changed for example due to a user touch. Such parameters include the frequency or period of the oscillation.

Since the input 106 is connected to the input of the analog-to-digital converter 102, the digital value output by the analog-to-digital converter 102 represents the voltage between the electrodes of the capacitance 114.

The limit checker 104 is configured to determine whether the digital value representing the input signal of the analog-to-digital converter 102 is within a predetermined range programmed into the limit checker 104 and to output a switching signal which is provided to a control input 116 of the switch 110. The limit checker 104 can in embodiments include a hardwired circuit or circuit element forming for example a state machine etc or a software implementation in which a software program which may for example run on a processor is used to perform the limit checker functions. Programming of the range can be prior to operation, at the starting of operation or during operation of the device 100. The limit checker 104 can be a general usable limit checker of a microcontroller which may be used for example also to determine out-of-range values in other operations such as controlling and sensing input channels of the microcontroller. The limit checker 104 may in exemplary embodiments be implemented as a block separate from the CPU (central processing unit) and may therefore offload the CPU from such tasks.

In embodiments, the lower threshold (lower limit) of the limit checker 104 is selected such that the digital value which corresponds to the momentary input signal of the analog-to-digital converter 102 reaches the lower threshold before the capacitance is fully discharged. Vice versa, the upper threshold (upper limit) may be selected such that the digital value which corresponds to the momentary input signal of the analog-to-digital converter 102 reaches the upper threshold before the capacitance is charged to the maximum possible voltage.

Assuming a maximum charging voltage to be the difference between the value $\phi 1$ which is the higher of the values of potentials 112a and 112b and the value $\phi 2$ of the potential of the second electrode 114b, i.e. $Vmax=\phi 1-\phi 2$, the settings of the thresholds of the limit checker 104 may be in one embodiment such that the upper threshold is between 60 and 95% of Vmax and the lower value is between 5% and 40% of Vmax. In other embodiments, the value may include other threshold limits such as for example between 70 and 90% of Vmax for the upper threshold and 10 and 30% of Vmax for the lower limit.

For example, when the second electrode 114b of the capacitance 114 is at ground potential, the thresholds of the predetermined range are programmed such that the upper threshold is lower than the higher of the first and second potentials 112a and 112b and the lower threshold is higher than the lower of the two potentials 112a and 112b.

In embodiments, the lower and upper thresholds are programmable to allow the sensing of capacitances of different value and for different applications. Furthermore, in some embodiments the programmable threshold may allow the long-term or short-term adapting of the sensing for example to compensate drifting caused for example by changes in environment etc. Therefore, in some embodiments, the settings of the threshold values may be changed from time to time or continuously updated depending on the value of the capacitance, intended appliance or other reasons. Furthermore, the programming allows using the same analog-to-digital converter 102 and limiting checker 104 in some embodiments in a multiplexing mode wherein the analog-to-digital converter 102 is connected by a multiplexer to other inputs connected to other capacitances. Since the threshold values can be easily changed by programming new values, each of the inputs can have in the multiplexing mode its individual threshold settings. It is to be noted that the analog-to-digital converter 102 can in the multiplexing mode also be used for other tasks such as sensing and controlling when the analog-to-digital converter 102 is multiplexed to other inputs.

When the digital value reaches one of the upper threshold or lower threshold of the predetermined range, a switching signal is provided to the control input 116. In more detail, when the upper threshold of the predetermined range is reached, a signal is applied to the switch which causes the switch element connected to the higher potential to be closed and causes the switch element connected to the lower potential to be opened in order to allow the discharging of the capacitance 114. Furthermore, when the digital value output by the analog-to-digital converter 102 reaches the lower threshold, a signal is applied to the control input 116 which causes the switch element connected to the lower potential to be opened and causes the switch element connected to the higher potential to be closed in order to allow the charging of the capacitance 114.

In order to distinguish whether the upper threshold or the lower threshold is reached, the limit checker 104 may be configured to provide different signals depending on the reaching of the upper or lower limit. For example the limit checker 104 may output a logical high value for reaching the upper threshold and a logical low value for reaching the lower threshold.

The oscillation provided by the repeated charging and discharging of the capacitance 114 provides an indication of the value of the capacitance 114 and may for example be used for determining whether significant changes of the capacitance value occurred.

In order to determine the capacitance or changes of the capacitance, the value of the frequency or time period of the oscillation or changes of these values are determined.

In one embodiment, the frequency or time period or changes thereof can be determined based on the switching signal provided by the limit checker 104. It is however to be noted that other implementations may also be used in other embodiments.

Figure 7:
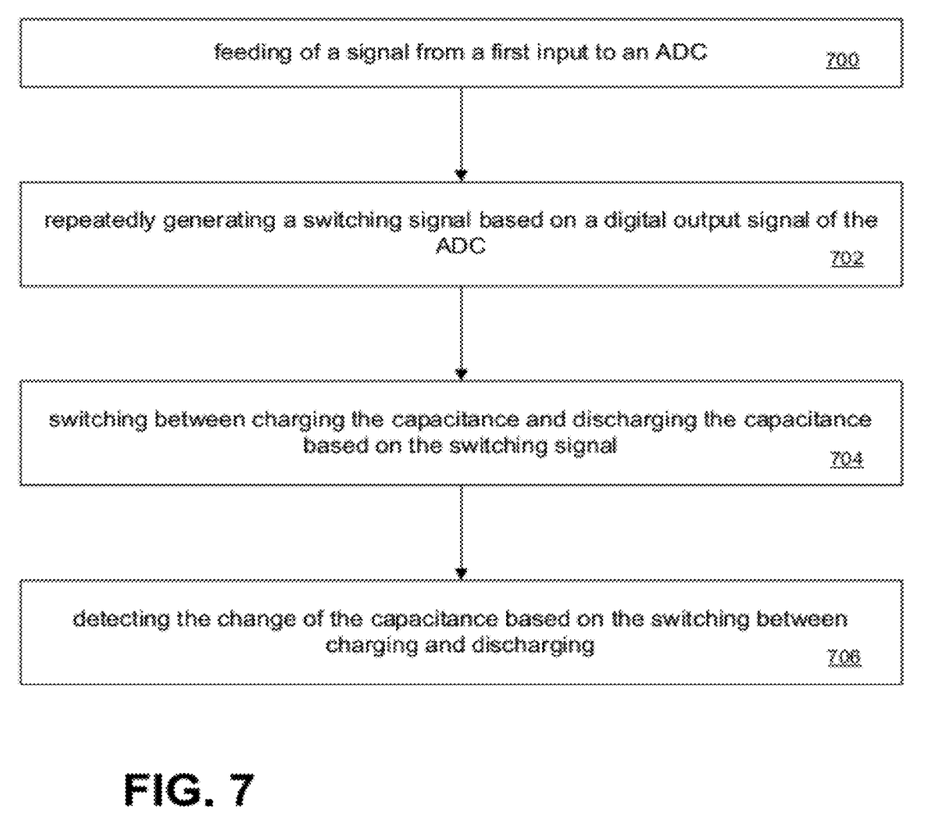
FIG. 7 an exemplary flow diagram.

An exemplary flow diagram for detecting a change of a capacitance is shown in FIG. 7. It starts at 700 with the feeding of a signal from a first input connected to the capacitance to an analog-to-digital converter 102. Then at 702, a switching signal is repeatedly generated a based on a digital output signal of the analog-to-digital converter 102. At 704, switching is performed between charging the capacitance and discharging the capacitance based on the switching signal. Then at 706, the change of the capacitance is detected based on the switching between charging and discharging.

As described above, the change of the capacitance may be detected based on a time period or frequency of successive switching signals. Furthermore, the repeatedly generating of a switching signal may include the repeatedly generating a digital value based on the signal at the input of the analog-to-digital converter 102 and determining whether the digital value is within a predetermined range. The generating the switching signal based on the determining whether the digital value is within the predetermined range. The predetermined range may be programmable range as outlined above such that a digital programming of the range can be performed. In addition, a multiplexing a plurality of inputs to the analog-to-digital converter 102 can be performed in an embodiment as will be described in more detail further below.

Figure 8:
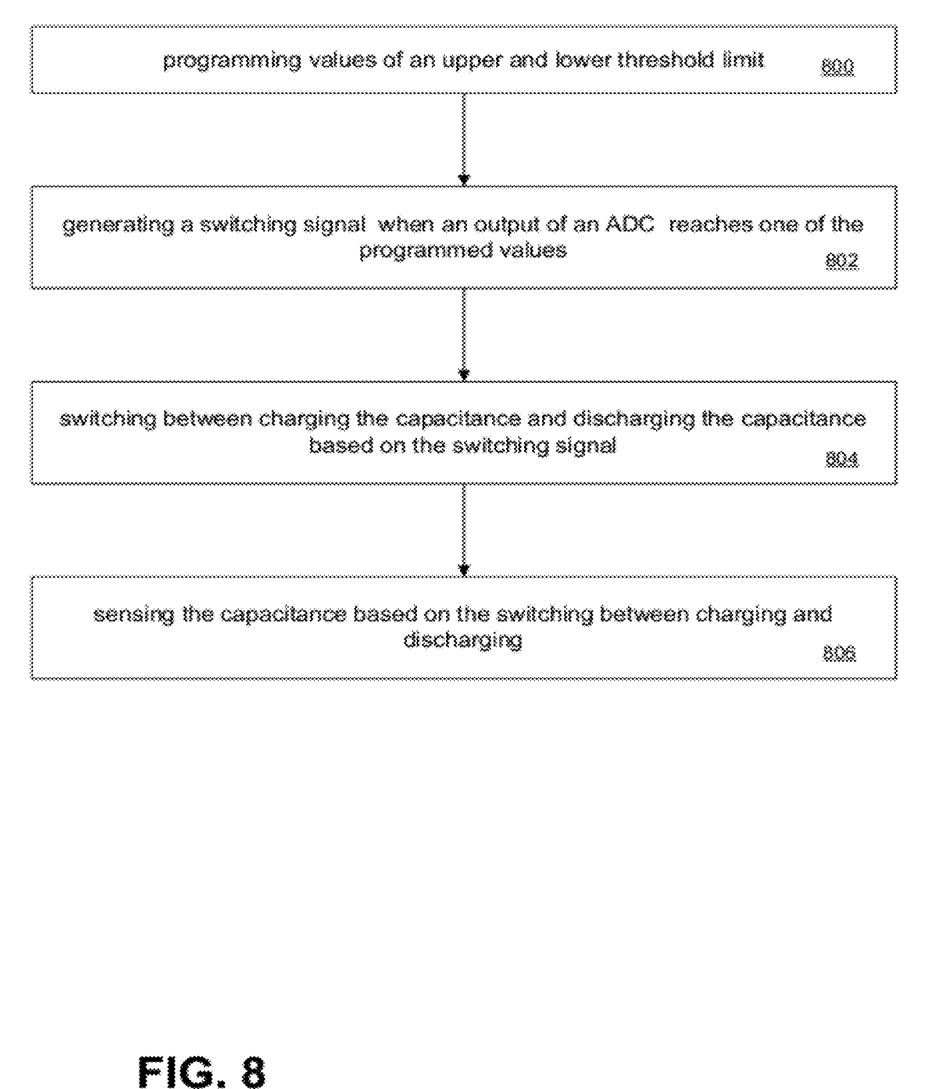
FIG. 8 an exemplary flow diagram.

An exemplary flow diagram for sensing a capacitance with programmed threshold limits is shown in FIG. 8. At 800, values of an upper and lower threshold limit are programmed. Programming may occur prior to capacitance sensing operation, at the start of capacitance sensing operating or during capacitance sensing operating. At 802, a switching signal is generated when an output of an analog-to-digital converter 102 reaches one of the programmed values. At 804, switching between charging the capacitance coupled to an input of the analog-to-digital converter 102 and discharging the capacitance is performed based on the switching signal. The capacitance is sensed at 806 based on the switching between charging and discharging.

Figure 2:
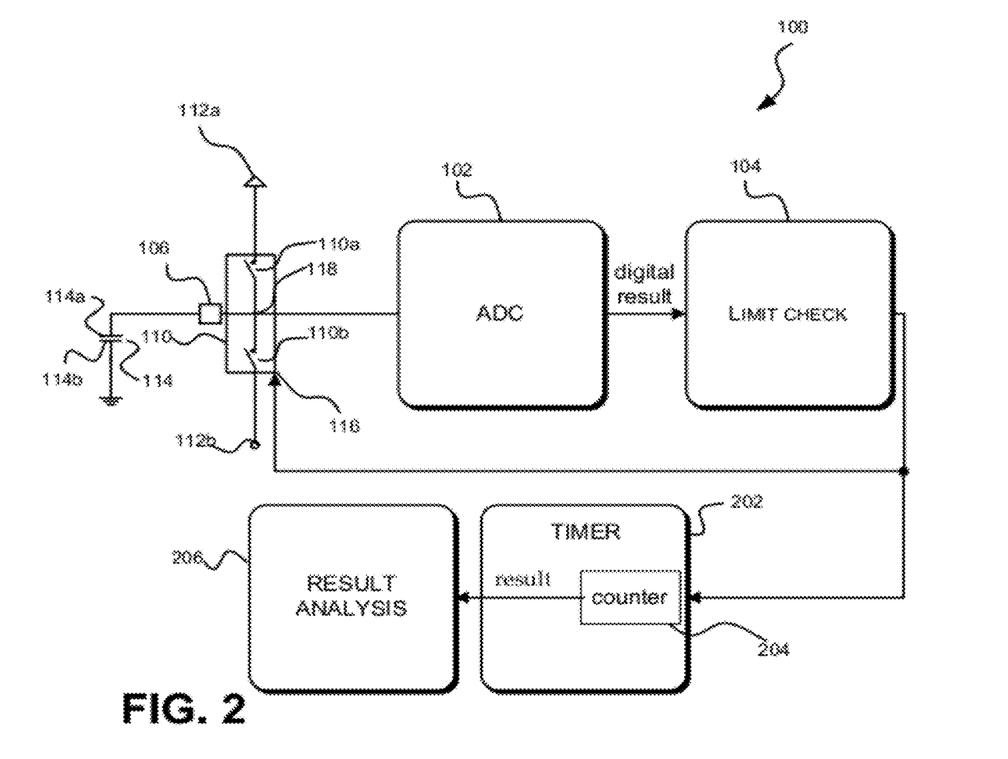
FIG. 2 shows a block diagram according to a further embodiment.

FIG. 2 shows an exemplary embodiment in which the switching signals directly provide the information for determining the oscillation frequency or changes of the oscillation frequency. In FIG. 2, the switching signals are provided to a Timer block 202 which includes a counter 204 for providing a count result corresponding to the time period between two successive switching signals. The count result is provided to a result analysis block 206 for analyzing and calculating the result provided by timer 202. It is to be noted that Timer blocks are typically included in semiconductor devices such as microcontrollers and therefore no additional hardware components are needed for implementing this exemplary embodiment.

Figure 3A:
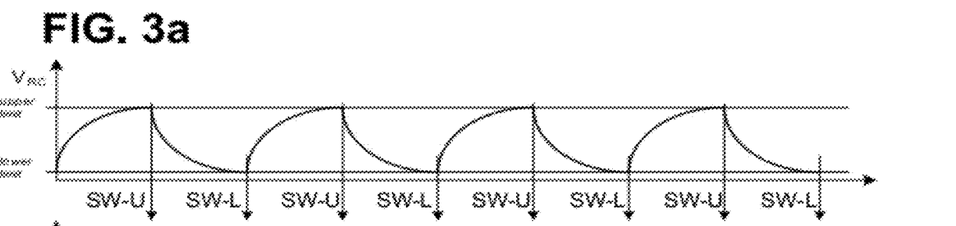
FIGS. 3a and 3b shows timing diagrams according to an embodiment.
Figure 3B:
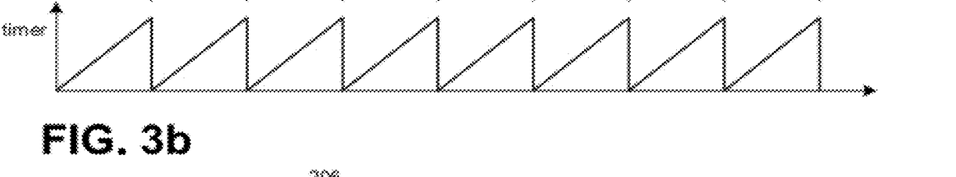

FIG. 3a shows an exemplary diagram showing the potential applied to the analog-to-digital converter 102 versus time. The switching signals provided by the limit checker 104 when the upper threshold is reached are indicated in FIG. 3a as SW-U and switching signals provided by the limit checker 104 when the lower threshold is reached are indicated in FIG. 3a as SW-L. FIG. 3b shows the corresponding internal timer signal versus time. The frequency is measured by the timer which captures the period time of the oscillation autonomously. The frequency of the oscillation depends on the value of the capacitance 114, the value of the impedances provided for charging the capacitance and the upper and lower threshold values. In an embodiment, the change of the frequency is detected by monitoring the counter results for example by comparing the counter results to previous counter results. In a touch sensing application this may indicate that a user has touched the touch sensitive capacitor which results in the increasing of the charging/discharging times for the capacitance. In other embodiments, the value of the capacitance may be directly calculated based on the values of the impedances and the programmed threshold values.

In some embodiments, only a subset of the switching signals may be used for determining the value of the capacitance. For example when the charging time and discharging time for the capacitance 114 are different due to differences in the charging impedances and discharging impedances, only the switching signals SW-U or only the switching signals SW-L may be used for determining the value of the capacitance or change of the capacitance value.

Figure 4:
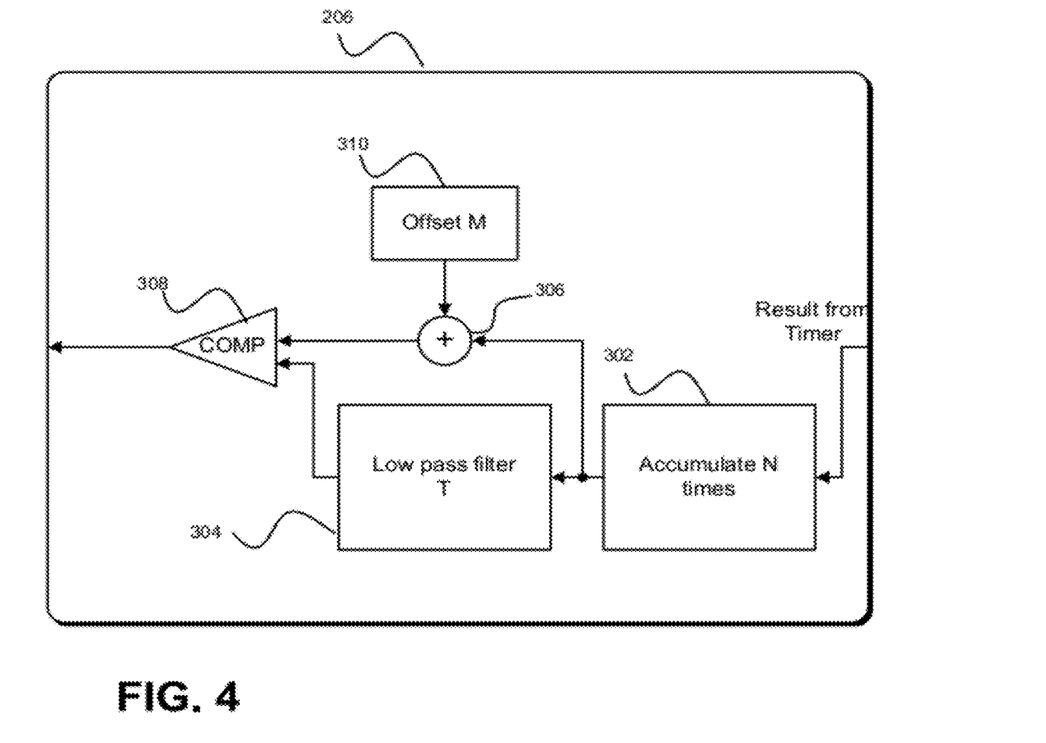
FIG. 4 shows a block diagram of an exemplary embodiment of a result analysis block.

FIG. 4 shows an exemplary embodiment of the result analysis block 206. According to the embodiment of FIG. 4, the result analysis block 206 includes a first low-pass filtering element 302 implemented as an accumulator. An output of the first low-pass filter element 302 is connected to a second low-pass filter element 304. The first and the second low-pass filter element 302 may for example include a sinc filter structure or any other known types of low-pass filters. The output of the first low-pass filter element 302 is further connected to a first input of an adder node 306. An offset value M 310 is provided to a second input of the adder node 306 and added to the output of the first low-pass filter element 302. The output of the adder node is connected to a first input of a comparator 308 to provide to the comparator the output result of the first filter element 302 corrected by the offset value. The output of the second filter element is connected to a second input of the comparator 308.

The result analysis block 206 shown in FIG. 4 provides increased robustness and/or increased sensitivity by filtering and processing the results provided by timer 202 to the result analysis block 206. In the first filter element 302, the results of the timer are averaged with a first time constant determined by the number N of accumulated samples. This averaging avoids false detection due to one time effects such as short glitches and further increases the sensitivity. The second low-pass filter element 304 has a time constant T and may be used to adapt the system to a specific value. For example, in touch sensing the system may be adapted to the idle value which is the output of the first filter element 302 when the touch sensitive element is not touched. The comparator 308 compares the accumulated value output from the first low-pass filter element 302 with the low-pass filtered result of the second low-pass filter element 304 and outputs a decision whether and to which extent the capacitance has changed. As a result of the above, only changes faster than a programmable time constant are detected. The programmable time constants of the filter elements allows in exemplary embodiments to have the time sensitivity of the capacitance detection programmed. In other words, in touch sensing applications, the minimal touch time of the touch pad or other touch sensitive element is programmable. As noted above, when multiplexing the input of the analog-to-digital converter 102 to other inputs, this programming of the touch time sensitivity allows for example to have for each input an individual touch time programmed.

The result analysis block 206 can be implemented in hardware, software or any combination thereof. The result analysis block 206 can be integrated into other circuit elements or can be a separate unit.

Figure 5:
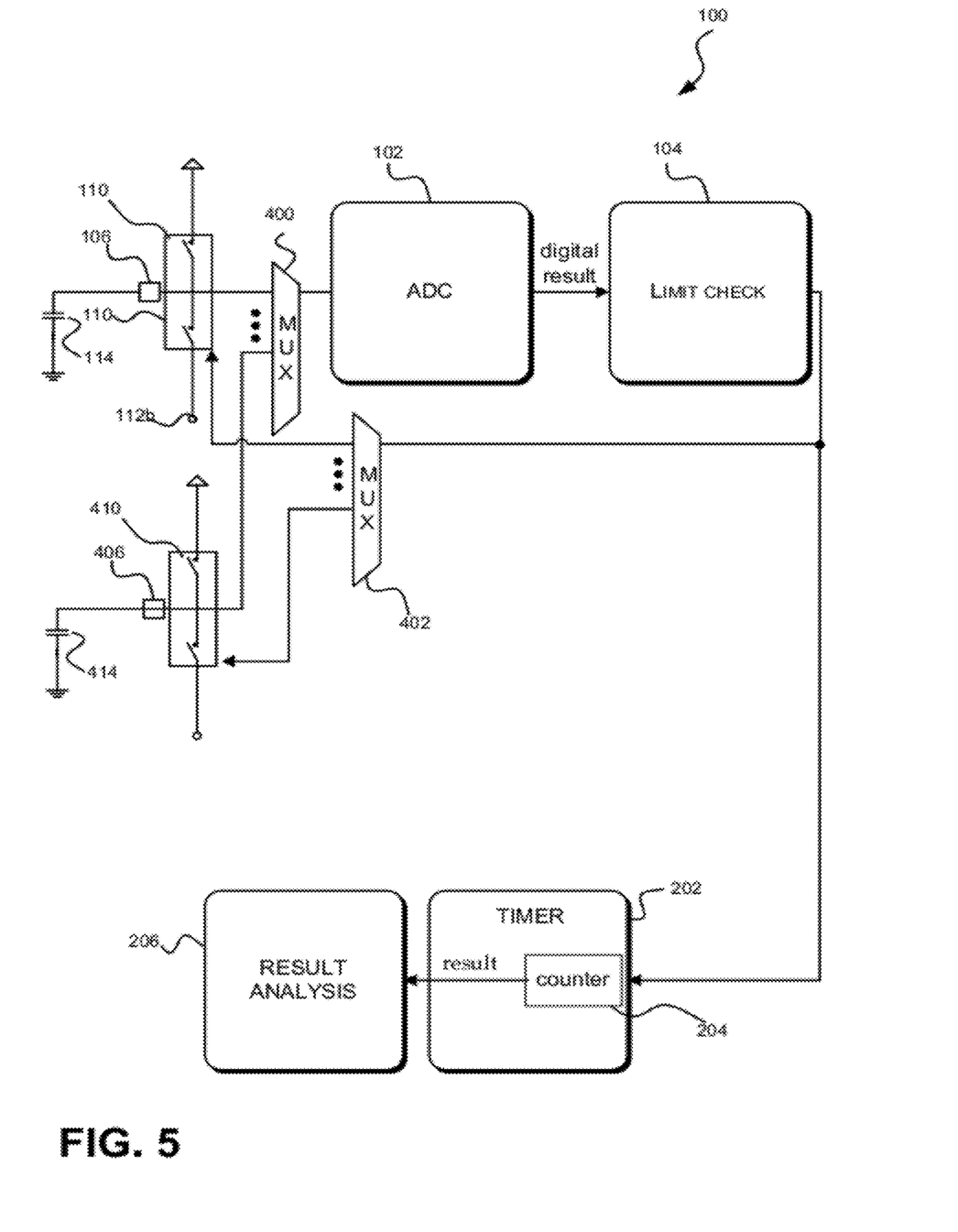
FIG. 5 shows a block diagram according to a further embodiment.

FIG. 5 shows an embodiment wherein the analog-to-digital converter 102 is multiplexed to other inputs by a multiplexer 400. FIG. 5 shows in addition to input 106 only one further input 406 with a corresponding switch 410 and a capacitance 414 connected to the input 406. However it is to be understood that any number of inputs may be connected to and multiplexed by the multiplexer 400 with the input of the analog-to-digital converter 102. Furthermore, corresponding to the multiplexer 400, a further multiplexer 402 is provided to multiplex the switching signals output by the limit checker 104 to the respective switches, for example switch 110 or 410.

It is further to be mentioned that the analog-to-digital converter 102 may be connected to inputs which are not connected to capacitance for example in order to sense or control signals on these inputs.

The multiplexing can be provided in an autonomous manner. For example, an auto scan function can be used in which the multiplexed channels corresponding to each input are scanned to determine which of the channels need a continuous scanning by the analog-to-digital converter 102. This provides an automatic initiation of the analog-to-digital conversion without the need of instructions from a CPU (central processing unit) and therefore further offloads the CPU. The autoscann function can be provided in one embodiment in regularly in predetermined time intervals. It may in some embodiments be possible to have the autoscann on a flexible basis for example triggered upon request etc.

In case more than one channel is determined to have the need for continuous scanning, arbitration techniques can be used to determine the scanning of theses channels.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" or "circuitry" used herein are to be interpreted in a sense not only including hardware but also software, firmware or any combinations thereof. Furthermore the terms "coupled" or "connected" may be interpreted in a broad sense not only covering direct but also indirect coupling.

It is further to be noted that embodiments described in combination with specific entities may in addition to an implementation in these entity also include one or more implementations in one or more sub-entities or sub-divisions of said described entity.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended.

It is further to be noted that methods disclosed in the specification or in the claims may be implemented by a device having means for performing each of the respective steps of these methods.

What is claimed is:
1. A microcontroller comprising:
   an analog-to-digital converter to provide a digital value based on an analog input signal from a capacitance, the digital value representing the voltage between electrodes of the capacitance;
   a limit checker to determine whether the digital value is within a predetermined range and to generate a first output signal when the digital value reaches an upper limit of the predetermined range and to generate a second output signal when the digital value reaches a lower limit of the predetermined range, the predetermined range being a programmable predetermined range associated with the limit checker;
at least a first input connected or connectable to the analog-to-digital converter;
at least one switch configured to alternately couple the first input to a first potential for charging the capacitance based on applying the second signal to the switch and to couple the first input to a second potential for discharging the capacitance based on applying the first signal to the switch; and
an entity capable to determine a value or a change of the capacitance based on the alternately charging and discharging of the capacitance.

2. The microcontroller according to claim 1, wherein the microcontroller is configured to charge and discharge the capacitance via at least one impedance.

3. The microcontroller according to claim 2, wherein the at least one impedance includes a pull-down resistor provided for a first input and a pull-up resistor provided for the first input.

4. The microcontroller according to claim 1, further comprising a multiplexer to multiplex a plurality of inputs to an input of the analog-to-digital converter.

5. The microcontroller according to claim 4, wherein each of the plurality of inputs comprises a pull-down resistor and a pull-up resistor.

6. The microcontroller according to claim 1, wherein the entity is configured to determine a change of the capacitance based on determining a time period or frequency of the charging and discharging.

7. The microcontroller according to claim 6, wherein the entity is configured to determine a change of the capacitance based on determining a time period or frequency of the output signals of the limit checker.

8. The microcontroller according to claim 7, wherein the entity is configured to determine the change of capacitance based on the following:
determining values for a time period or frequency of successive output signals of the limit checker;
averaging the determined values to obtain a first averaged value; and
comparing the first averaged value with a second value.

9. The microcontroller according to claim 8, wherein the first averaged value represents a value averaged over a first time period and the second value represents a value for the time period or frequency averaged at least over a second time period longer than the first time period.

10. The microcontroller according to claim 1, wherein the microcontroller comprises a plurality of inputs connectable to the analog-to-digital converter, the plurality of inputs including the first input for touch sense detection and at least one further input for providing controlling or sensing functionality.

11. A method for detecting a change of a capacitance comprising:
feeding a signal from a first input connected to the capacitance to an analog-to-digital converter;
repeatedly generating a switching signal based on a digital output signal of the analog-to-digital converter, the repeatedly generating act including
repeatedly generating a digital value based on the signal at the input of the analog-to-digital converter,
determining whether the digital value is within a predetermined range,
generating the switching signal based on the determining whether the digital value is within the predetermined range, the predetermined range being a programmable predetermined range;
switching between charging the capacitance and discharging the capacitance based on the switching signal; and
detecting the change of the capacitance based on the switching between charging and discharging.

12. The method according to claim 11, wherein the switching comprises alternately switching a first impedance between a first potential and the first input and switching a second impedance between the first input and a second potential.

13. The method according to claim 12, wherein the switching comprises alternately switching a pull-up resistor between the first potential and the first input and switching a pull-down resistor between the second potential and the first input.

14. The method according to claim 11, wherein the change of the capacitance is detected based on a time period or frequency of successive switching signals.

15. The method according to claim 11, further comprising multiplexing a plurality of inputs to the analog-to-digital converter.

16. A method for sensing a capacitance comprising:
programming values of an upper and lower threshold limit.
generating a switching signal when an output of an analog-to-digital converter reaches one of the programmed values;
switching between charging a capacitance coupled to an input of the analog-to-digital converter and discharging the capacitance, the switching being based on the switching signal;
sensing the capacitance based on the switching between charging and discharging.

17. The method according to claim 16, wherein the capacitance is sensed based on change of a time period of successive switching signals or a change of a frequency of successive switching signals.

18. The method according to claim 17, wherein the capacitance is sensed based on the following:
determining values for a time period or frequency of successive switching signals;
averaging the determined values to obtain a first averaged value; and
comparing the first averaged value with a second value.

19. The method according to claim 18, wherein the first averaged value represents a value averaged over a first time period and the second value represents a value averaged over a second time period which is longer than the first time period.

20. The method according to claim 16, wherein the upper and lower thresholds are thresholds programmed into a multi-purpose limit checker connected to an output of the Analog-to-Digital converter.

21. The method according to claim 16, further comprising multiplexing a plurality of input ports to the input of the analog-to-digital converter.

22. The method according to claim 18, wherein switching between charging a capacitance and discharging a capacitance comprises:
alternately switching a pull-up resistor of a microcontroller between a first input coupled to the capacitance and a first potential and switching a pull-down resistor of the microcontroller between the first input and a second potential.

23. A device comprising:
an oscillator circuit to provide an oscillation used for determining a value or a change of a capacitance, the oscillator circuit comprising:

a circuit to provide a digital value based on an analog input signal;

a limit checker to determine whether the digital value is within a programmed range and to generate an output signal when the digital value is determined to be out of the predetermined range, the predetermined range being a programmable predetermined range associated with the limit checker;

at least a first input coupled to an input of the analog-to-digital converter;

at least one switch configured to alternately connect an electrode of the capacitance to a first potential and to a second potential to alternately charge and discharge the capacitance via at least one impedance, the at least one switch being controlled based on the output signal of the limit checker.

* * * * *